United States Patent
Zhao et al.

(10) Patent No.: US 12,142,241 B2
(45) Date of Patent: *Nov. 12, 2024

(54) DISPLAY DRIVER SYSTEM WITH EMBEDDED NON-VOLATILE MEMORY

(71) Applicant: HEFEI RELIANCE MEMORY LIMITED, Hefei (CN)

(72) Inventors: Liang Zhao, Sunnyvale, CA (US); Zhichao Lu, San Jose, CA (US); Zhigang Han, Nonthaburi (TH)

(73) Assignee: Hefei Reliance Memory Limited, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/083,355

(22) Filed: Dec. 16, 2022

(65) Prior Publication Data
US 2023/0118250 A1  Apr. 20, 2023

Related U.S. Application Data

(63) Continuation of application No. 16/842,385, filed on Apr. 7, 2020, now Pat. No. 11,557,264.
(Continued)

(51) Int. Cl.
*G09G 5/00* (2006.01)
*G11C 7/10* (2006.01)
*H04N 5/57* (2006.01)

(52) U.S. Cl.
CPC ............. *G09G 5/006* (2013.01); *G11C 7/10* (2013.01); *G09G 2320/0233* (2013.01); *H04N 5/57* (2013.01)

(58) Field of Classification Search
CPC .. G09G 5/006; G09G 2320/0233; G11C 7/10; H04N 5/57
See application file for complete search history.

(56) References Cited

U.S. PATENT DOCUMENTS 7,499,322 B2   3/2009   Lee et al.
10,222,683 B2  3/2019   Kitagawa
(Continued)

FOREIGN PATENT DOCUMENTS

CN   101256828 A   9/2008
CN   201436632 U   4/2010
(Continued)

OTHER PUBLICATIONS

Wiki ("Phase-change memory", https://en.wikipedia.org/wiki/Phase-change_memory, 2018) (Year: 2018).*
(Continued)

*Primary Examiner* — Xin Sheng
(74) *Attorney, Agent, or Firm* — Sheppard Mullin Richter & Hampton LLP

(57) ABSTRACT

Circuitry for adjusting luminance of a display device is provided. The circuitry includes a non-volatile memory array having a plurality memory cells configured to store luminance data of the display device, and a luminance adjusting circuit configured to receive image data to be displayed on the display device. The luminance adjusting circuit is coupled directly to the non-volatile memory array to receive the luminance data of the display device from the non-volatile memory array and adjust the image data based on the luminance data of the display device.

14 Claims, 7 Drawing Sheets

Related U.S. Application Data

(60) Provisional application No. 62/832,224, filed on Apr. 10, 2019.

(56) References Cited

U.S. PATENT DOCUMENTS

| | | | |
|---|---|---|---|
| 11,410,614 | B2 | 8/2022 | Zahirovic et al. |
| 2009/0295764 | A1 | 12/2009 | Lin et al. |
| 2016/0125843 | A1 | 5/2016 | Kim et al. |
| 2018/0308416 | A1* | 10/2018 | Chen .................. G06T 1/60 |
| 2019/0080731 | A1* | 3/2019 | Kavalieros .......... G11C 7/1051 |
| 2019/0086730 | A1* | 3/2019 | Huang ................ G09G 3/3648 |
| 2019/0130811 | A1 | 5/2019 | Yonezawa |

FOREIGN PATENT DOCUMENTS

| | | | |
|---|---|---|---|
| CN | 106488083 | A | 3/2017 |
| CN | 106531045 | A | 3/2017 |
| CN | 107396022 | A | 11/2017 |
| CN | 107610661 | A | 1/2018 |
| CN | 107767327 | A | 3/2018 |
| CN | 108377370 | A | 8/2018 |
| CN | 108877631 | A | 11/2018 |
| CN | 108877666 | A | 11/2018 |
| CN | 108962139 | A | 12/2018 |
| IN | 101944314 | A | 1/2011 |
| IN | 107221290 | A | 9/2017 |
| JP | 2010020813 | A * | 1/2010 |
| JP | 2014-071184 | A | 4/2014 |
| JP | 2016170184 | A * | 9/2016 |
| WO | WO-2015141730 | A1 * | 9/2015 |
| WO | WO-2017037228 | A1 * | 3/2017 |
| WO | 2018/057766 | A1 | 3/2018 |

OTHER PUBLICATIONS

Chen, Sherman Xuemin, and Gordon Yong Li. "A mathematical theory of compressed video buffering: Traffic regulation for end-to-end video network QoS." APSIPA Transactions on Signal and Information Processing 4 (2015). As Chen2015 (Year: 2015).*
First Search dated Mar. 15, 2021, issued in related Chinese Application No. 202010276100.2 (1 page).
First Office Action dated Mar. 26, 2021, issued in related Chinese Application No. 202010276100.2, with English machine translation (9 pages).
Supplementary Search dated Sep. 22, 2021, issued in related Chinese Application No. 202010276100.2 (1 page).
First Search dated Sep. 26, 2022, issued in related Chinese Application No. 202111590390.9 (3 pages).
Chen, Sherman Xuemin, and Gordon Yong Li. "A mathematical theory of compressed video buffering: Traffic regulation for end-to-end video network QoS." APSIPA Transactions on Signal and Information Processing 4 (2015) (Year: 2015).
First Office Action dated Oct. 8, 2022, issued in related Chinese Application No. 202111590390.9, with English machine translation (15 pages).
Non-Final Office Action dated Dec. 17, 2021, issued in related U.S. Appl. No. 16/842,385 (37 pages).
Final Office Action dated Jul. 21, 2022, issued in related U.S. Appl. No. 16/842,385 (47 pages).
Notice of Allowance dated Oct. 18, 2022, issued in related U.S. Appl. No. 16/842,385 (9 pages).

* cited by examiner

DISPLAY DRIVER SYSTEM WITH EMBEDDED NON-VOLATILE MEMORY

CROSS REFERENCE TO RELATED APPLICATIONS

This application is a continuation of U.S. patent application Ser. No. 16/842,385, filed Apr. 7, 2020, entitled "DISPLAY DRIVER SYSTEM WITH EMBEDDED NON-VOLATILE MEMORY," which claims benefits of U.S. Provisional Application No. 62/832,224, filed Apr. 10, 2019, entitled "OLED DISPLAY DRIVER SYSTEM WITH EMBEDDED NVM." The disclosures of all of the above-referenced applications are incorporated by reference herein in their entirety.

TECHNICAL FIELD

The disclosure relates generally to integrated circuits, and more specifically to display drivers.

BACKGROUND

Display driver integrated circuits (DDIC) includes a class of integrated circuits that provide interface functions between a particular microprocessor/microcontroller/application-specific integrated circuit (ASIC)/interface, and a particular display device including but not limited to a liquid crystal display (LCD), a light emitting diode (LED) display, an organic light emitting diode (OLED) display, etc. The display driver typically accepts commands and data through an industry-standard general-purpose interface, and generates signals with a suitable voltage/current/timing to make the display show the desired images.

OLED displays are entering mainstream mobile devices. For such applications, DDICs are expected to be low-cost and have small form-factor and high performance. FIG. 1 is a block diagram illustrating a conventional display driver system 100. The display driver system 100 includes a mobile industry processor interface (MIPI) 102, a digital signal compression (DSC) encoder 104, a data buffer (Dbuf) 106, a static random access memory (SRAM) 108, a DSC decoder 110, a screen color management (SCM) block 112, a fringe adjustment block 114, a sub-pixel rendering (SPR) block 116, a de-mura block 118, a flash memory 120, another SRAM 122, a de-gamma (gamma correction) block 124, a timing control (T-con) block 126, an analog circuit 128, a general purpose input/output (GPIO) interface 130, and a display panel 132.

The MIPI 102 defines a serial bus and a communication protocol between the host (source of the image data) and the display system 100 (destination of the image data). The MIPI 102 may forward the received image/pixel data to the DSC encoder 104 and the data buffer 106. The DSC encoder 104 is configured to encode/compress pixel data using a DSC standard, and send the encoded pixel data to the data buffer 106. The data buffer 106 temporarily stores the pixel data compressed with the DSC standard in the SRAM 108. The compressed pixel data is then sequentially forwarded to DSC decoder 110, which decodes the next available pixel data with the DSC standard into pixel/RGB data. The screen color management block 112 receives the RGB data/signals and translates the color from the original color space to a designated color space (designated either by a designer or user) associated with the display panel 132 (e.g., an OLED display).

The fringe adjustment block 114 is configured to process the pixel data based on a particular shape (e.g., the bezel/notch part) of the display panel 132, such as a display for a mobile device. For example, the fringe adjustment block 114 may remove some pixel data at the edge/fringe portions of an image such that the image can be properly displayed on a mobile phone. The sub-pixel rendering block 116 is configured to increase the apparent resolution of the display panel 132 by separately rendering RGB pixels using the underlying physical properties of the display panel 132.

The de-mura block 118 is configured to calibrate the luminance data across the screen and use the data to calculate individual correction to each pixel, in order to achieve more uniform luminance/appearance of the display panel 132. Due to manufacturing variations, each pixel of the display panel 132 may have a slight luminance difference from each other given a same driving condition. For example, when all pixels of the display panel 132 are given a same driving voltage or current, the pixels may exhibit different brightness, thus degrading the visual experience for a user. The de-mura block 118 is designed to correct such variations. To achieve that, the display system 100 further contains a flash memory 120 and an SRAM 122. The flash memory 120 is configured to store mura information for the display panel 132. For example, the mura information is generated based on a luminance measure for each individual display panel. The mura information is written into the flash memory 120 via an input/output 120-1 of the flash memory 120. When the display panel 132 is powered on, the data is read from the flash memory 120 into the SRAM 122. When image data is read at the de-mura block 118, the mura information is output via the SRAM's input/output 122-1 to the de-mura block 118, which then use the mura information to calibrate the luminance data of the image data.

The de-gamma block 124 is configured to transform frame/image data and accommodate the non-linear relationship between the luminance and the input voltage. The image data is then sent to the T-Con block 126 and the analog circuit 128. The T-Con block 126 is a control circuit for the analog circuit 128, which generates voltages/currents for driving the pixels of the display panel 132. The driving signals from the analog circuit 128 are sent to the display panel 132 via the GPIO interface 130 to drive the pixels of the display panel 132.

SUMMARY

One aspect of the present disclosure is directed to circuitry for adjusting luminance of a display device. The circuitry includes a non-volatile memory array having a plurality memory cells configured to store luminance data of the display device, and a luminance adjusting circuit configured to receive image data to be displayed on the display device. The luminance adjusting circuit is coupled directly to the non-volatile memory array to obtain the luminance data of the display device from the non-volatile memory array and adjust the image data based on the luminance data of the display device.

In some embodiments, the circuitry further includes a memory control circuit coupled to the non-volatile memory array and configured to control operations of the non-volatile memory array. In some embodiments, the circuitry further includes an input/output interface coupled to the memory control circuit and configured to receive the luminance data from outside of the circuitry.

In some embodiments, the memory control circuit and the input/output interface are embedded in the luminance adjusting circuit.

In some embodiments, the non-volatile memory array includes one of a resistive random access memory, a phase-change random access memory, a ferroelectric random access memory, or a spin-transfer torque magnetic random access memory.

In some embodiments, the non-volatile memory array is a one-time programmable memory. In some embodiments, the non-volatile memory array includes a redundant memory section configured to correct an error of the luminance data after the one-time programmable memory is programmed with the luminance data. In some embodiments, the non-volatile memory array includes a plurality of memory banks, and the luminance adjusting circuit is configured to receive in parallel a set of data from the plurality of memory banks and output in series pixel data corresponding to the set of data.

In another aspect, a display control circuit is provided. The display control circuit includes an input interface configured to receive image data to be displayed on a display device; circuitry configured to adjust the image data to generate adjusted image data; and an output interface configured to output to the display device display signals generated based on the adjusted image data. The circuitry includes a non-volatile memory array having a plurality memory cells configured to store luminance data of the display device, and a luminance adjusting circuit configured to receive the image data to be displayed on the display device. The luminance adjusting circuit is coupled directly to the non-volatile memory array to obtain the luminance data of the display device from the non-volatile memory array and adjust the image data based on the luminance data of the display device.

In some embodiments, the display control circuit further includes a digital signal compression encoder coupled to the input interface and configured to encode the image data received from the input interface to generate encoded image data, a data buffer coupled to the digital signal compressing encoder and the input interface, the data buffer being configured to store the encoded image data and the image data, and a digital signal compression decoder coupled to the data buffer and configured to decode the encoded image data.

In some embodiments, the data buffer includes a non-volatile memory device. In some embodiments, the non-volatile memory device is a multiple-time programmable memory device. In some embodiments, the non-volatile memory device includes one of a resistive random access memory device, a phase-change random access memory device, a ferroelectric random access memory device, or a spin-transfer torque magnetic random access memory device.

These and other features of the apparatuses, systems, and methods, disclosed herein, as well as the methods of operation and functions of the related elements of structure, will become more apparent upon consideration of the following description and the appended claims with reference to the accompanying drawings, all of which form a part of this specification. It is to be expressly understood, however, that the drawings are for purposes of illustration and description only and are not intended as a definition of the limits of the disclosure. It is to be understood that the foregoing general description and the following detailed description are exemplary and explanatory only, and are not restrictive of the disclosure, as claimed.

BRIEF DESCRIPTION OF THE DRAWINGS

Non-limiting embodiments of the disclosure may be more readily understood by referring to the following drawings.

DETAILED DESCRIPTION OF THE EMBODIMENTS

Non-limiting embodiments of the present disclosure will now be described with reference to the drawings. It should be understood that particular features and aspects of any embodiment disclosed herein may be used and/or combined with particular features and aspects of any other embodiment disclosed herein. It should also be understood that such embodiments are by way of example and are merely illustrative of a small number of embodiments within the scope of the present disclosure. Various changes and modifications obvious to one skilled in the art to which the present disclosure pertains are deemed to be within the spirit, scope and contemplation of the present disclosure as further defined in the appended claims.

Mura/unevenness effect in luminance is common to display devices. For example, for OLED displays, each pixel is an individual light emitter and pixel-to-pixel variations can cause non-uniform luminance across the screen/panel, a.k.a. mura. This effect causes visual unevenness to a user and needs to be mitigated. Generally, during OLED manufacturing/testing processes, the luminance data across a screen can be measured and recorded. These data can be used to calculate individual correction of applied voltage/current to each pixel, resulting in uniform appearance of the display. The process is called mura correction, or de-mura. The luminance non-uniformity is recorded once for each screen, and typically would not change significantly during the service life of the screen. The memory capacity for de-mura purposes is proportional to the total number of pixels of the screen.

Techniques disclosed herein provide solutions in which memory for a de-mura block can be fast programmed and read, and have good data retention (at least 85° C. for 10 years), low power consumption during read, and small form factor for mobile applications.

Figure 1:
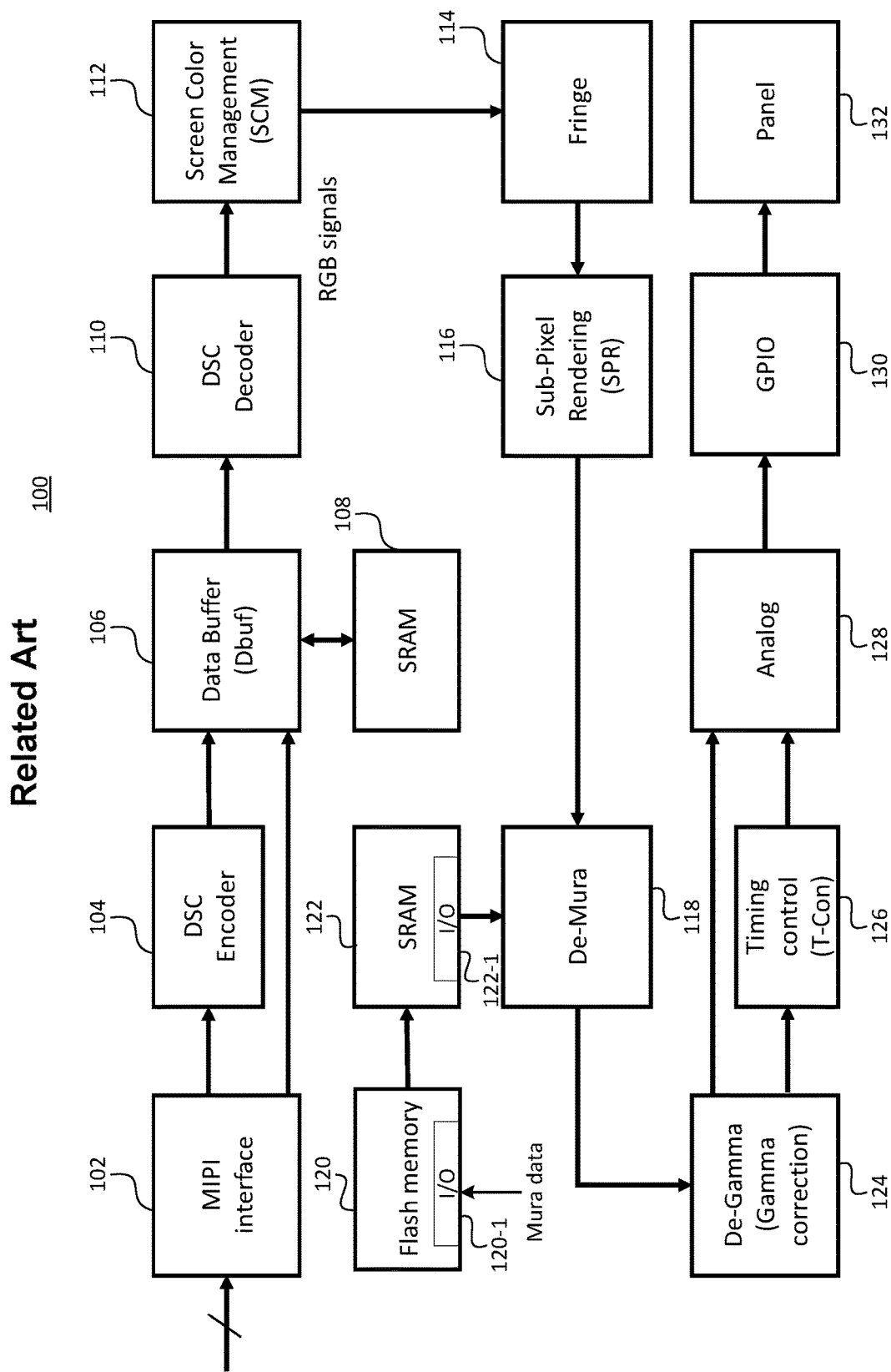
FIG. 1 is a block diagram illustrating a conventional display driver system.
Figure 2:
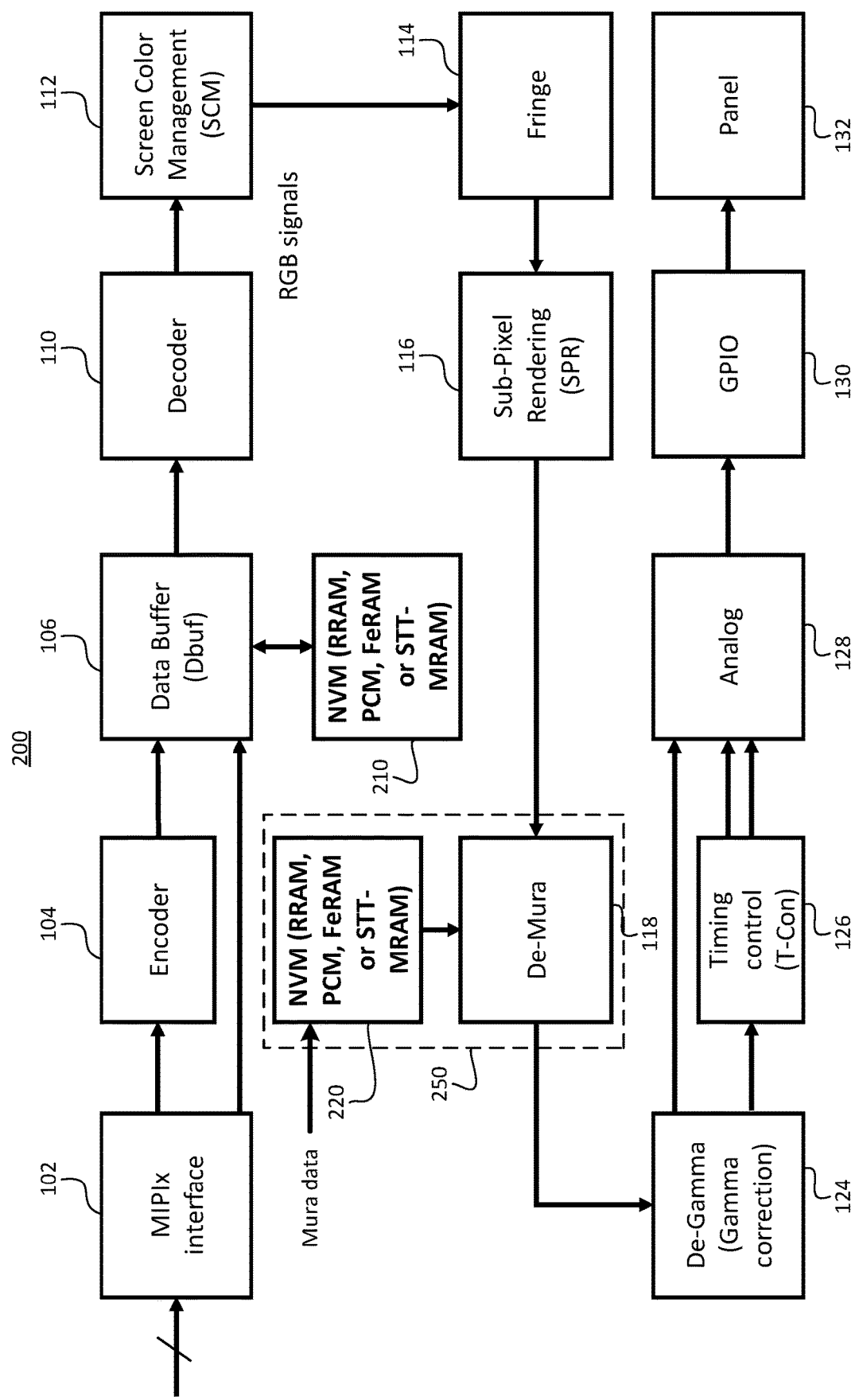
FIG. 2 is block diagram of a display device, according to an example embodiment.

Example embodiments will be explained below with accompanying figures. Reference is now made to FIG. 2. FIG. 2 is block diagram of a display device 200, according to an example embodiment. The display device 200 is similar to the display device 100 of FIG. 1 except that the display device 200 uses a first non-volatile memory (NVM) device 210 coupled to the data buffer 106, and a second non-volatile memory (NVM) device 220 coupled to the de-mura block 118. As other components of the display device 200 are similar to those of the display device 100, detailed description of those components will not be provided again. The de-mura block 118 and the second non-volatile memory (NVM) device 220 form a circuit 250 for adjusting luminance of a display device. For example, the circuit 250 is configured to correct mura effect for the display panel 132 of the display device 200.

Figure 3:
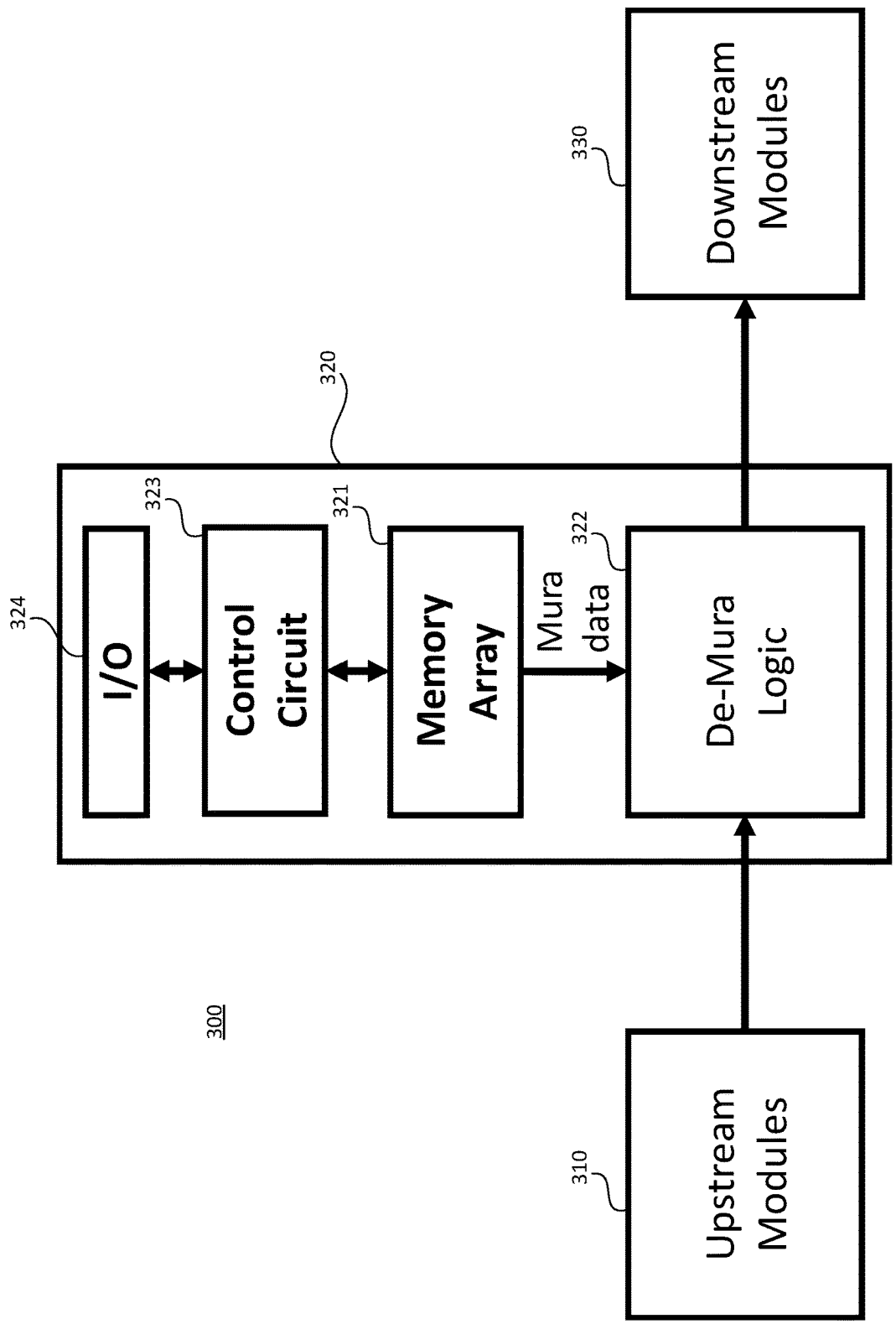
FIG. 3 is a block diagram illustrating a display control device for controlling luminance of a display device according to an example embodiment.

FIG. 3 is a block diagram illustrating a display control device 300 for controlling luminance of a display device according to an example embodiment. The display control device 300 includes one or more upstream modules 310, circuitry 320, and one or more downstream modules 330. The upstream modules 310 are configured to receive and process image data for pixels of a display device. The display device may be an LCD, LED, or OLED panel, or other display panels currently known or hereinafter developed. The circuitry 320 is configured to adjust luminance of the display device. In some embodiments, the circuitry 320 is configured to adjust luminance of the display device to correct mura effects on the display device. The downstream modules 330 are configured to further process the image data from the circuitry 320 and generate, based on the image data, drive signals to drive the display device.

In some embodiments, the circuitry 320 includes a non-volatile memory array 321 having a plurality memory cells configured to store luminance/mura data of the display device. In some embodiments, the luminance data of the display device include luminance measurements for pixels of the display device. For example, the luminance data may include luminance measurements for all pixels on the display device. The circuitry 320 further includes a luminance adjusting circuit 322 configured to receive from the upstream modules 310 image data to be displayed on the display device. In the illustrated embodiment, the luminance adjusting circuit 322 may be a de-mura logic. When the luminance adjusting circuit 322 receives the image data, it obtains luminance/mura data from the memory array 321 and calibrates the image data to compensate for the unevenness of luminance across the display device, resulting in displaying an improved image on the display device. As shown in FIG. 3, the luminance adjusting circuit 322 is coupled directly to the non-volatile memory array 321 to receive the luminance data of the display device from the non-volatile memory array 321 and to adjust the image data based on the luminance data of the display device. The luminance/mura data flows one way from the non-volatile memory array 321 to the luminance adjusting circuit 322.

In some embodiments, the circuitry 320 further includes a control circuit 323 coupled to the non-volatile memory array 321 and configured to control operations of the non-volatile memory array 321. The circuitry 320 also includes an input/output (I/O) 324 coupled to the memory control circuit and configured to receive the luminance data from outside of the circuitry 320. For example, luminance/mura data of the display device is measured and written into the memory array 321 via the I/O 324. As compared to de-mura function that includes the de-mura block 118, the flash memory 120 (with its I/O 120-1), and the SRAM 122 (with its I/O 122-1), the circuitry 320 for adjusting luminance/mura effect eliminates the interface between a memory device (e.g., the memory array 321) and a de-mura logic 322. Further, the circuitry 320 includes one I/O interface 324, instead of two (I/Os 120-1 and 122-1 in FIG. 1) to obtain the luminance/mura data for the de-mura logic 322. This reduces the complexity of the circuitry for correcting the mura effect.

In some embodiments, the non-volatile memory array 321 includes one of a resistive random access memory, a phase-change random access memory, a ferroelectric random access memory, or a spin-transfer torque magnetic random access memory. In some embodiments, the non-volatile memory array 321 is a one-time programmable memory. That is, non-volatile memory array 321 can be written with data only once. In some embodiments, the non-volatile memory array 321 is a multi-time programmable memory that can be reprogrammed more than one time.

In some embodiments, when the memory array 321 includes a resistive random access memory, each of memory cells on the memory array 321 may include one transistor (T) and one resistive (R) device (1T1R). As compared to the conventional de-mura function that includes a SRAM, which generally requires six transistors in a memory cell, the memory array 321 consumes fewer chip areas. Moreover, because operation of an SRAM requires standby power, the circuitry 320 also uses less power due to no standby power for the non-volatile memory array 321. The non-volatile memory array 321 requires comparable or lower read current than an SRAM array. Further, the non-volatile memory array 321 has a faster response than an SRAM array as, in the conventional de-mura function, the luminance/mura data needs to be read from a flash memory to the SRAM array. Another advantage of the circuitry 320 is that it includes no flash memory.

Figure 4:
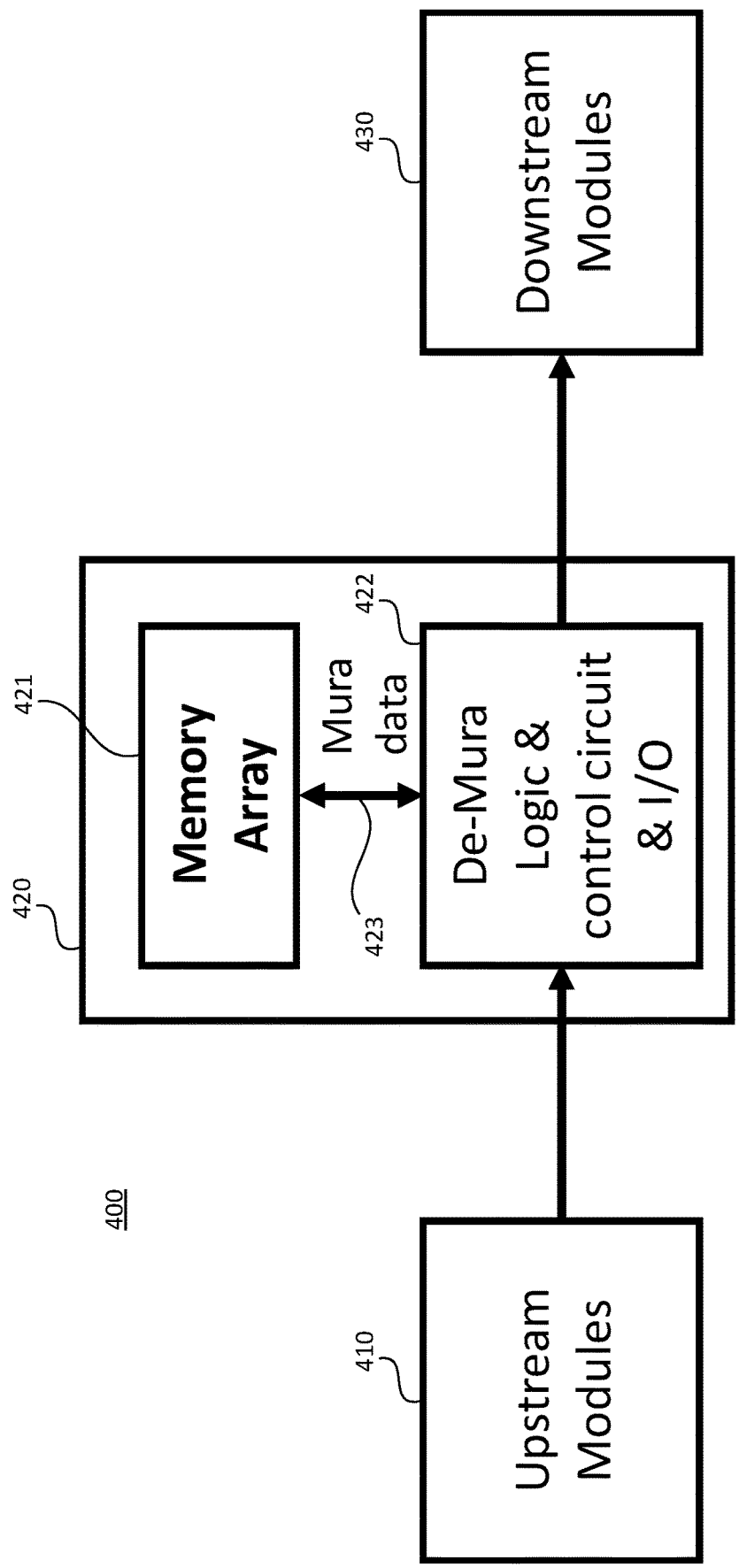
FIG. 4 is a block diagram illustrating another display control device for controlling luminance of a display device according to an example embodiment.

FIG. 4 is a block diagram illustrating a display control device 400 for controlling luminance of a display device according to an example embodiment. The display control device 400 includes one or more upstream modules 410, circuitry 420, and one or more downstream modules 430. The upstream modules 410 and the downstream modules 430 are similar to the upstream modules 310 and the downstream modules 330 of FIG. 3, and their functions will not be further described here. The circuitry 420 is configured to adjust luminance of the display device. In some embodiments, the circuitry 420 is configured to adjust luminance of the display device to correct mura effects on the display device.

In some embodiments, the circuitry 420 includes a non-volatile memory array 421 having a plurality memory cells configured to store luminance/mura data of the display device, and a luminance adjusting circuit 422 coupled directly to the non-volatile memory array 421 via a communication channel 423. The luminance adjusting circuit 422 includes de-mura logic for calibrating the image data to compensate for the unevenness of luminance across the display device. Further, a control circuit and an I/O interface for the non-volatile memory array 421 are embedded in the luminance adjusting circuit 422. The luminance/mura data for the display device are written into the non-volatile memory array 421 via the luminance adjusting circuit 422 that contains the control circuit and the I/O interface for the non-volatile memory array 421. When the de-mura logic of the luminance adjusting circuit 422 receives image data from the upstream modules 410, it obtains the luminance/mura data from the memory array 421 to calculate corrected pixel luminance values for the pixels of the display device.

In the circuitry 420, because the control circuit and the I/O interface for the non-volatile memory array 421 are embedded in the luminance adjusting circuit 422, there is no external I/O for the memory array 421. Further, the non-volatile memory array 421 can be programmed using the I/O interface in the luminance adjusting circuit 422. This structure eliminates the need for an external I/O for the non-volatile memory array 421 and may save cost to implement the display control device 400. Thus, two-way traffic is implemented on the communication channel 423.

Figure 5:
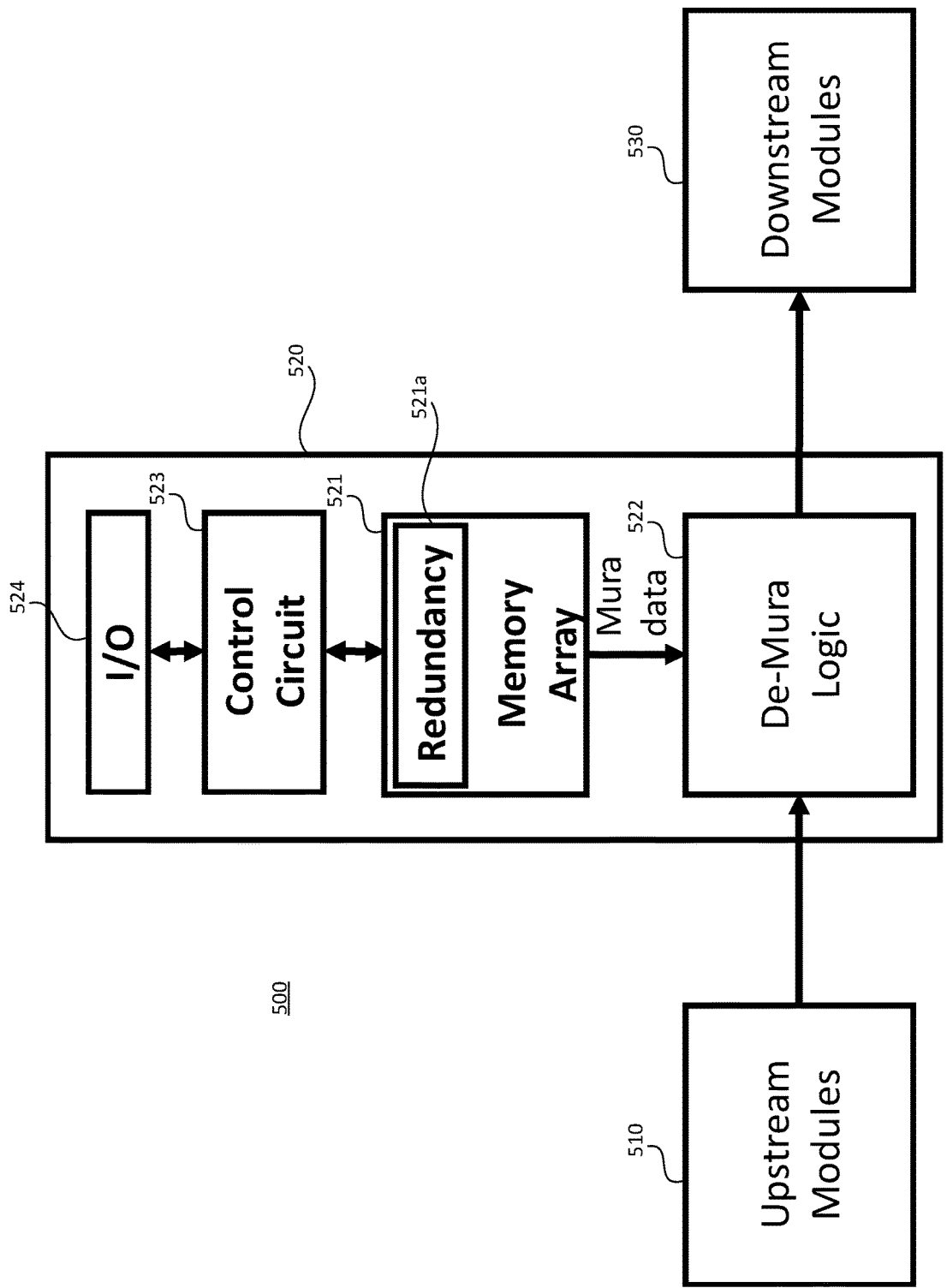
FIG. 5 is a block diagram illustrating another display control device for controlling luminance of a display device according to an example embodiment.

FIG. 5 is a block diagram illustrating yet another display control device 500 for controlling luminance of a display device according to an example embodiment. The display control device 500 includes one or more upstream modules 510, circuitry 520 for adjusting luminance, and one or more downstream modules 530. The circuitry 520 includes a non-volatile memory array 521, a luminance adjusting circuit 522, a control circuit 523 for controlling the non-volatile memory array 521, and an I/O interface 524.

The display control device 500 is similar to the display control device 300 in FIG. 3 except that the non-volatile memory array 521 of the display control device 500 further includes a redundant memory section 521*a*. The redundant memory section 521*a* is configured to correct an error of the luminance/mura data after the one-time programmable memory 521 is programmed with the luminance/mura data. In some instances, the luminance/mura data may be incorrectly written into the non-volatile memory array 521, or the luminance/mura data in some cells of the non-volatile memory array 521 may be lost due to, e.g., faulty cells. When this happens, the data stored at the redundant memory section 521*a* may be employed to correct the errors after the luminance/mura data are programmed in the non-volatile memory array 521. In some embodiments, the errors may be corrected using algorithms, including but not limited to, low-density parity-check (LDPC), cyclic codes, Hamming codes, etc.

Because pixels of a display device are arranged in an array including rows and columns, the luminance/mura data for the pixels of the display device may be stored in a non-volatile memory array (e.g., 321, 421, and 521) in a similar fashion. In some embodiments, the non-volatile memory array that stores the luminance/mura data for the pixels of the display device is accessed sequentially during read and write operations. In some embodiments, a non-volatile memory array may be partitioned into a plurality of memory banks to store the luminance/mura data such that a luminance adjusting circuit can obtain in parallel a set of luminance data from the plurality of memory banks and output in series pixel data corresponding to the set of data.

Figure 6:
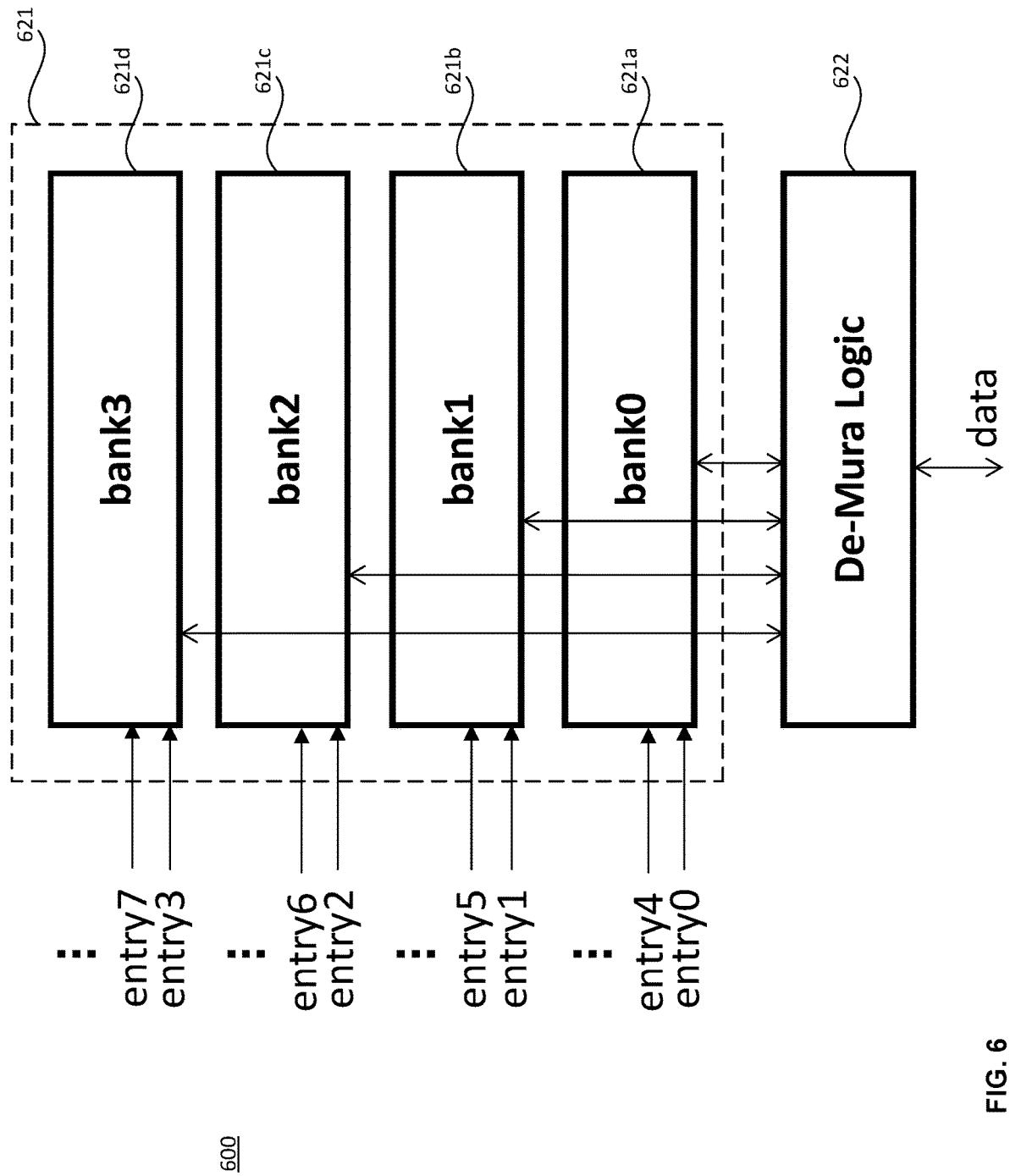
FIG. 6 is a block diagram illustrating yet another display control device for controlling luminance of a display device according to an example embodiment.

FIG. 6 is a block diagram illustrating another display control device 600 for controlling luminance of a display device according to an example embodiment. The display control device 600 includes a non-volatile memory array 621 and a de-mura logic 622 for providing mura correction for a display device. The non-volatile memory array 621 is partitioned into four memory banks 621*a* (bank0), 621*b* (bank1), 621*c* (bank2), and 621*d* (bank3). It should be understood that the non-volatile memory array 621 may be partitioned into more or fewer than four memory banks. For example, data entries 0-7 are luminance/mura data for pixels 1-8 located in a row of a display device. The data entries 0 and 4 (for pixels 1 and 5) are stored in memory bank 621*a*; the data entries 1 and 5 (for pixels 2 and 6) are stored in memory bank 621*b*; the data entries 2 and 6 (for pixels 3 and 7) are stored in memory bank 621*c*; and the data entries 3 and 7 (for pixels 4 and 8) are stored in memory bank 621*d*. During write operations, entries 0-3 may be written in parallel or in series into the memory banks 621*a*-621*d*. That is, four luminance data entries may be written in parallel or in series into four memory banks. In the next write operation, entries 4-7 may be written in parallel or in series into the memory banks 621*a*-621*d*.

During read operations, the de-mura logic 622 is configured to obtain data entries 0-3 in parallel from the memory banks 621*a*-621*d* and use the luminance data stored therein to calibrate image luminance data for pixels 1-4. The de-mura logic 622 then outputs the pixel luminance data in series for pixel 1-4. That is, the de-mura logic 622 is configured to read luminance data for mura correction from the memory banks in parallel and output pixel luminance data in series. The techniques allows accessing multiple luminance data entries in parallel at a slow speed and reading or writing data at a normal chip clock frequency to match the throughput need. In some embodiments, the techniques help to improve speed and/or design margins for a display control device.

Figure 7:
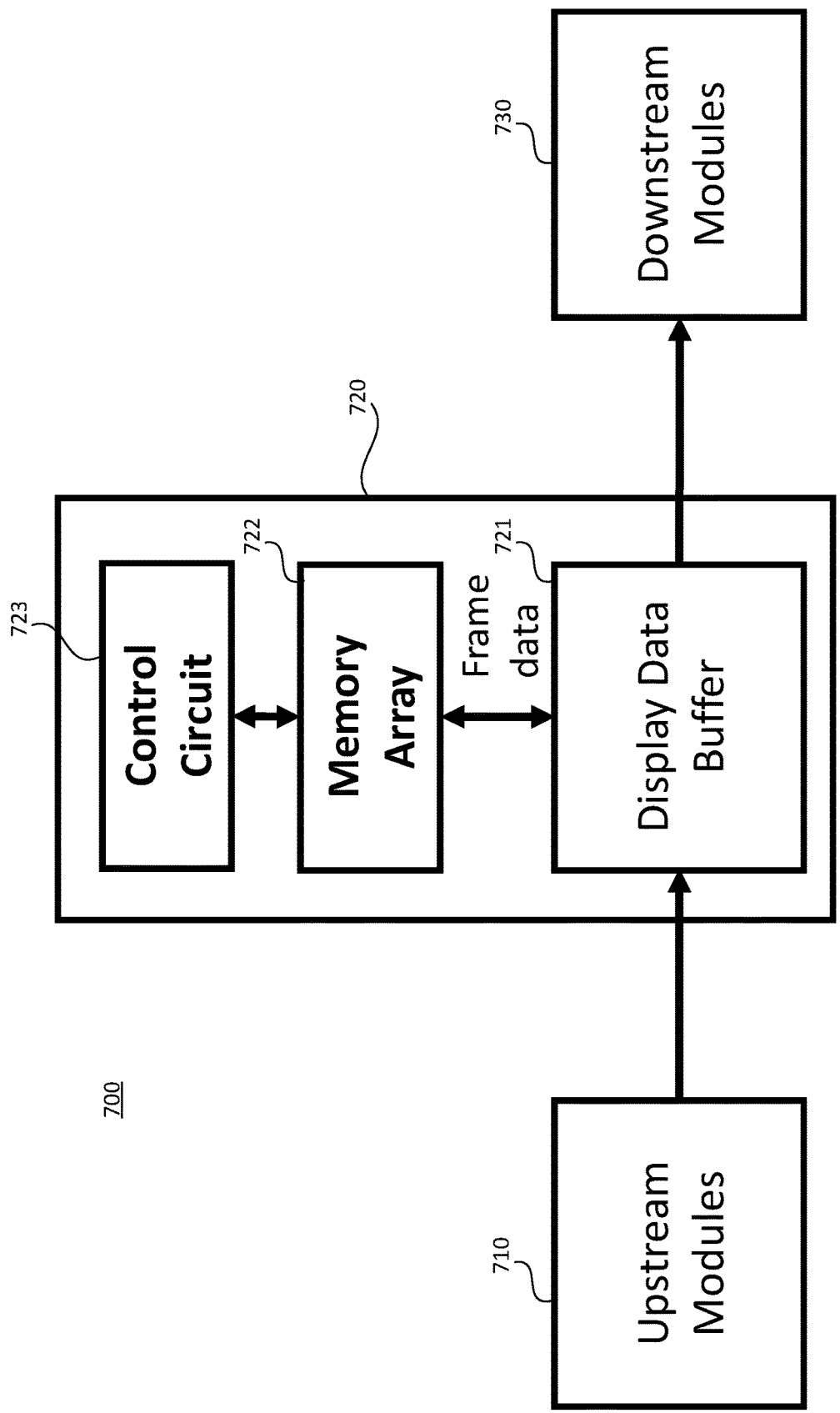
FIG. 7 is a block diagram illustrating a display control device having a display data buffer device for controlling luminance of a display device according to an example embodiment.

FIG. 7 is a block diagram illustrating another display control device 700 having a display data buffer device for controlling luminance of a display device according to an example embodiment. The display control device 700 includes one or more upstream modules 710, a display data buffer device 720, and one or more downstream modules 730. For example, the upstream modules 710 may include a digital signal compression encoder (e.g., encoder 104 in FIG. 2) coupled to an input interface (e.g., MIPI 102 in FIG. 2) and configured to encode the image data received from the input interface to generate encoded image data. The display data buffer device 720 is coupled to the digital signal compressing encoder and the input interface, and is configured to store the encoded image data and the image data. The downstream modules 730 may include a digital signal compression decoder (e.g., decoder 110 in FIG. 2) coupled to the display data buffer device 720 and configured to decode the encoded image data.

The display data buffer device 720 includes a display data buffer 721, a non-volatile memory array 722, and a control circuit 723 for controlling the non-volatile memory array 722. The display data buffer 721 may write frame data into and read frame data from the non-volatile memory array 722. For this purpose, the non-volatile memory array 722 is configured to be a multiple-time programmable memory device. In some embodiments, the non-volatile memory array 722 includes one of a resistive random access memory device, a phase-change random access memory device, a ferroelectric random access memory device, or a spin-transfer torque magnetic random access memory device.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

What is claimed is:

1. A luminance circuit comprising:
a one-time programmable non-volatile memory array comprising:
a luminance data memory configured to store luminance data of a display device, and
a redundant memory configured to store error correction data to correct an error of the luminance data;
a luminance adjust circuit configured to receive image data to be displayed on the display device;
a memory control circuit coupled to the one-time programmable non-volatile memory array and configured to control operations of the one-time programmable non-volatile memory array; and
an input/output interface coupled to the memory control circuit and configured to receive the luminance data from outside of the luminance circuit;
wherein the luminance adjust circuit is coupled directly to the one-time programmable non-volatile memory array to obtain the luminance data of the display device and the error correction data from the one-time programmable non-volatile memory array and adjust the image data based on the luminance data of the display device and the error correction data, wherein the memory control circuit and the input/output interface are embedded in the luminance adjust circuit.

2. The luminance circuit of claim 1, wherein the error correction data comprises an error correction algorithm to correct the error of the luminance data.

3. The luminance circuit of claim 2, wherein the error correction algorithm comprises at least one of:
a low-density parity-check (LDPC);
cyclic codes; or
Hamming codes.

4. The luminance circuit of claim 1, wherein the one-time programmable non-volatile memory array comprises one of:
a resistive random access memory;
a phase-change random access memory;
a ferroelectric random access memory; or
a spin-transfer torque magnetic random access memory.

5. A luminance circuit comprising:
a one-time programmable non-volatile memory array comprising:
a luminance data memory configured to store luminance data of a display device, and
a redundant memory configured to store error correction data to correct an error of the luminance data; and
a luminance adjust circuit configured to receive image data to be displayed on the display device;
wherein the luminance adjust circuit is coupled directly to the one-time programmable non-volatile memory array to obtain the luminance data of the display device and the error correction data from the one-time programmable non-volatile memory array and adjust the image data based on the luminance data of the display device and the error correction data wherein the one-time programmable non-volatile memory array comprises:
a plurality of memory banks, wherein the luminance adjust circuit is configured to receive data in parallel from the plurality of memory banks and output in series pixel data corresponding to the image data, the data comprising the luminance data of the display device and the error correction data.

6. A display control circuit, comprising:
an input interface configured to receive image data to be displayed on a display device; and
a luminance circuit configured to adjust the image data to generate adjusted image data, wherein the luminance circuit comprises:
a one-time programmable non-volatile memory array comprising:
a luminance data memory configured to store luminance data of the display device, and
a redundant memory configured to store error correction data to correct an error of the luminance data;
a memory control circuit coupled to the one-time programmable non-volatile memory array and configured to control operations of the one-time programmable non-volatile memory array; and
an input/output interface coupled to the memory control circuit and configured to receive the luminance data from outside of the luminance circuit;
wherein the luminance adjust circuit is coupled directly to the one-time programmable non-volatile memory array to obtain the luminance data of the display device and the error correction data from the one-time programmable non-volatile memory array and adjust the image data based on the luminance data of the display device and the error correction data, wherein the memory control circuit and the input/output interface are embedded in the luminance adjust circuit.

7. The display control circuit of claim 6, wherein the error correction data comprises an error correction algorithm to correct the error of the luminance data.

8. The display control circuit of claim 7, wherein the error correction algorithm comprises at least one of:
a low-density parity-check (LDPC);
cyclic codes; or
Hamming codes.

9. The display control circuit of claim 6, wherein the one-time programmable non-volatile memory array comprises one of:
a resistive random access memory;
a phase-change random access memory;
a ferroelectric random access memory; or
a spin-transfer torque magnetic random access memory.

10. The display control circuit of claim 6, further comprising:
a digital signal compression decoder configured to receive encoded image data from a data buffer, and to generate the image data by decoding the encoded image data.

11. The display control circuit of claim 10, further comprising:
a digital signal compression encoder configured to receive input image data from the input interface, to generate the encoded image data by encoding the input image data, and to store the encoded image data in the data buffer.

12. The display control circuit of claim 11, wherein:
the input interface is a mobile industry processor interface (MIPI) interface.

13. The display control circuit of claim 6, further comprising:
an output interface configured to output to the display device display signals generated based on the adjusted image data.

14. A display control circuit comprising:
a one-time programmable non-volatile memory array comprising:

a luminance data memory configured to store luminance data of a display device, and a redundant memory configured to store error correction data to correct an error of the luminance data; and a luminance adjust circuit configured to receive image data to be displayed on the display device;

wherein the luminance adjust circuit is coupled directly to the one-time programmable non-volatile memory array to obtain the luminance data of the display device and the error correction data from the one-time programmable non-volatile memory array and adjust the image data based on the luminance data of the display device and the error correction data, wherein the one-time programmable non-volatile memory array comprises:

a plurality of memory banks, wherein the luminance adjust circuit is configured to receive data in parallel from the plurality of memory banks and output in series pixel data corresponding to the image data, the data comprising the luminance data of the display device and the error correction data.

* * * * *